(12) United States Patent
Kennedy et al.

(10) Patent No.: US 6,780,028 B1
(45) Date of Patent: Aug. 24, 2004

(54) SOLDER RESERVE TRANSFER DEVICE AND PROCESS

(75) Inventors: Craig M. Kennedy, San Marcos, CA (US); Donald S. Eisenberg, Carlsbad, CA (US)

(73) Assignee: Autosplice Systems Inc., San Diego, CA (US)

( * ) Notice: Subject to any disclaimer, the term of this patent is extended or adjusted under 35 U.S.C. 154(b) by 0 days.

(21) Appl. No.: 10/310,215

(22) Filed: Dec. 6, 2002

(51) Int. Cl.[7] .............................................. H01R 12/00
(52) U.S. Cl. ......................................... 439/83; 439/876
(58) Field of Search .......................... 439/83, 876, 877, 439/82, 751; 228/180.1; 174/52, 263, 266; 361/400, 401, 403, 405, 406

(56) References Cited

U.S. PATENT DOCUMENTS 5,699,612 A * 12/1997 Inoue et al. .................. 29/843

6,402,531 B1 * 6/2002 Legrady ....................... 439/83

OTHER PUBLICATIONS

Electronic Packaging and Interconnection Handbook, Ed. C.A. Harper, McGraw–Hill, 1997.*

* cited by examiner

Primary Examiner—Alexander Gilman

(57) ABSTRACT

A solder transfer method which uses an electrically-conductive, e.g., metal, surface, of a stamping or pin or pad as a vehicle to transfer molten solder from a remote solder reserve to a solder joint to be made. In a preferred embodiment, a solder deposit previously-formed on a surface mount pad during a first reflow step will transfer up to the adjoining contact surfaces by a wicking process to provide the additional solder needed to fabricate a robust solderjoint. When one of the contact surfaces is a contact or pin on a first PCB, and the other contact surface is a SMT pad on a second PCB serving, for example, as a memory card, the process of the invention makes for an easy SMT processed attachment of the memory card to the first PCB without the need to add solder during a second reflow step to make a robust solder joint between the contact surfaces.

18 Claims, 9 Drawing Sheets

SOLDER RESERVE TRANSFER DEVICE AND PROCESS

The invention is directed to printed circuit boards (PCB) or the like, to electronic devices for interconnecting PCBs, to devices for mounting PCBs onto a substrate, and to processes for solder attaching electronic components to a substrate. The invention is also particularly concerned with attaching a daughter card to a motherboard, especially to permanently attach a daughter card perpendicular to a motherboard.

BACKGROUND OF INVENTION

Nowadays, there are several ways to attach a daughter card perpendicular to a motherboard. These include the following.

1. Removable Edge Card Connector—There are available several removable edge card connector designs where the daughter card such as a memory card, arranged perpendicular to the motherboard, is inserted into a group of pins or contacts that are pre-loaded with a determined amount of force. These contacts are held in place by a molded insulator and hard soldered to the motherboard. The result is a non-soldered, removable interconnect between the memory card or edge card connector and the PCB.

2. Submerged Soldering—Another method of lead attachment comprises inserting the memory card or other PCB with surface mount technology (SMT) pads between two rows of contacts that are held together in a carrier, which is sometimes also referred to as a header. This assembly is fluxed and then submerged into a solder bath up to the SMT pads on the memory card or PCB. This approach results in a permanent soldered interconnect, which, however, requires that the PCB's or memory cards be singulated and put through a secondary process, off-line, which is time-consuming and expensive.

3. Hand Soldering—This attachment method requires a single point solder reflow for each individual contact. An operator would touch a soldering iron and solder wire to make each solder joint. This method is slow and very labor intensive and also requires secondary processing off-line.

4. Screen Print/ Solder Bump—In this scheme, during placement of other components on the PCB, solder paste is placed on the SMT pads on the "A" side of a printed circuit board (the terms "A" side and "B" side are meant to designate the two major surfaces of a PCB, with the A side representing the first surface processed and the B side the opposite surface) components are placed onto the paste and then the assembly is reflowed. "Reflowing" is a term of art typically meaning that an assembly is fluxed and then heated to a temperature above the melting point of any solder present causing the solder to penetrate adjacent crevices between solderable electrically-conductive surfaces, typically of copper or a copper alloy, such that upon cooling the solder freezes forming a permanent electrical connection between the electrically-conductive surfaces. The PCB board is then flipped,wet screen paste is applied on the B side, components are placed on the B side, and then a connector for the memory card is placed over the bumps on the A side SMT pads and their leads are placed into the "soft" paste on the SMT pads on the B side, followed by both sides being reflowed. This process does not produce a desirable solder attachment because the leads of the connector are spread when placed over the bumps to the memory card leaving a space or gap between the pin contact region and the SMT pad after reflow.

SUMMARY OF INVENTION

A principal object of the invention ,is to solder-attach leads to the edge contacts of a PCB, such as a memory card, for attachment to another PCB, such as a motherboard.

Another object of the invention is to solder-attach leads to the edge contacts of a PCB, such as a memory card, for perpendicular attachment to a motherboard without the need to add solder during this last process.

A further object of the invention is an in-line process for permanently soldering the adjoining contact surfaces of electrical components by reflowing solder without separately adding directly to the joint additional solder during the reflow step to fabricate a robust solder joint between the components.

These and other objects are achieved in accordance with one feature of the invention by a solder transfer method which uses an electrically-conductive, e.g., metal, surface, stamping or pin or pad as a vehicle to transfer molten solder from a remote solder reserve to a solder joint to be made.

In a preferred embodiment of the invention, a solder deposit previously-formed on a surface mount pad during a first reflow will transfer up to the adjoining contact surfaces by a wicking process to provide the additional solder needed to fabricate a robust solderjoint. When, for example, one of the contact surfaces is a contact or pin on a first PCB or carrier, and the other contact surface is a SMT pad on a second PCB serving, for example, as a memory card, the process of the invention makes for an easy SMT processed attachment of the memory card to the first PCB without the need to add solder during a second reflow step (only requiring fluxing before reflow) to make a robust solderjoint between the contact surfaces.

In accordance with another preferred embodiment of the invention, a PCB, for example, with traces and plated through-holes, serving as a carrier or header, can be employed as the first PCB to provide a change-spacing method for the center to center and row to row spacing from the top to the bottom of the carrier. In other words, the top spacing can be chosen to match the contact spacing of the second PCB, and the bottom spacing can be chosen to match the (different) contact spacing of a third PCB on which the second PCB is to be mounted. Again, no additive solder processing is required. Alternatively, SMT interconnects rather than plated through-holes can be employed.

In accordance with another feature of the invention, a carrier with dual rows of pins forming contact surfaces for receiving the edge connector of a card provides the additional solder as a reflowed deposit on side surfaces of the pins.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention, like reference numerals or letters signifying the same or similar components.

DETAILED DESCRIPTION OF PREFERRED EMBODIMENTS

While the invention will be described in a preferred embodiment of soldering an edge connector, such as a memory card, in a perpendicular orientation to a PCB, it will be understood that the invention has broad applications with respect to PCBs generally, carriers for components, headers, and in any application where it is necessary to make robust solder joints between the electrically-conductive surfaces of pins: pads and other shapes and configurations of electrical contacts. Also, when the term "PCB" is used herein, it means in general any electrically-insulating 4 substrate or substrate portion that has or will be provided with an electrically conductive surface or surfaces. Well-known examples are substrates such as FR-4, ceramic, plastic, Teflon. Often, the electrically-conductive surface is a metal pin engaging a plated through-hole in the board enabling the projecting parts of the pin to be used for connection to other components or devices. Other times, the pin also contacts an electrically-conductive trace or contact pad on the PCB which can be used for connection to other components or devices. Other well-known possibilities are SMT pads on the substrate surface used for the external connection or connected to a pin or solder bump contact. An important application of the invention is where a PCB, such as a memory card, with edge contacts as a daughter board is to be permanently edge mounted onto a motherboard having traces to be connected to those on the memory card, but where the motherboard is provided with a female connector for receiving the male pins of a plug connector, lacking on the memory card, or the memory card lacks a contact array that matches the contact array on the motherboard. Preferably, the mounting of the daughter board to the motherboard is to be made in an in-line process which at the same time attaches further components to the motherboard. In a preferred embodiment of the invention, the daughter board is first mounted on a carrier as a connector which is chosen such that its contacts on a first surface match that of the daughter board, while the carrier's contacts on a second surface match that of the motherboard. By "in-line" process is meant that, during a single reflow step, a number of interconnected boards with temporarily-mounted components and connectors can all be reflowed and thus permanently solder-bonded in the same standard process.

Figure 1:
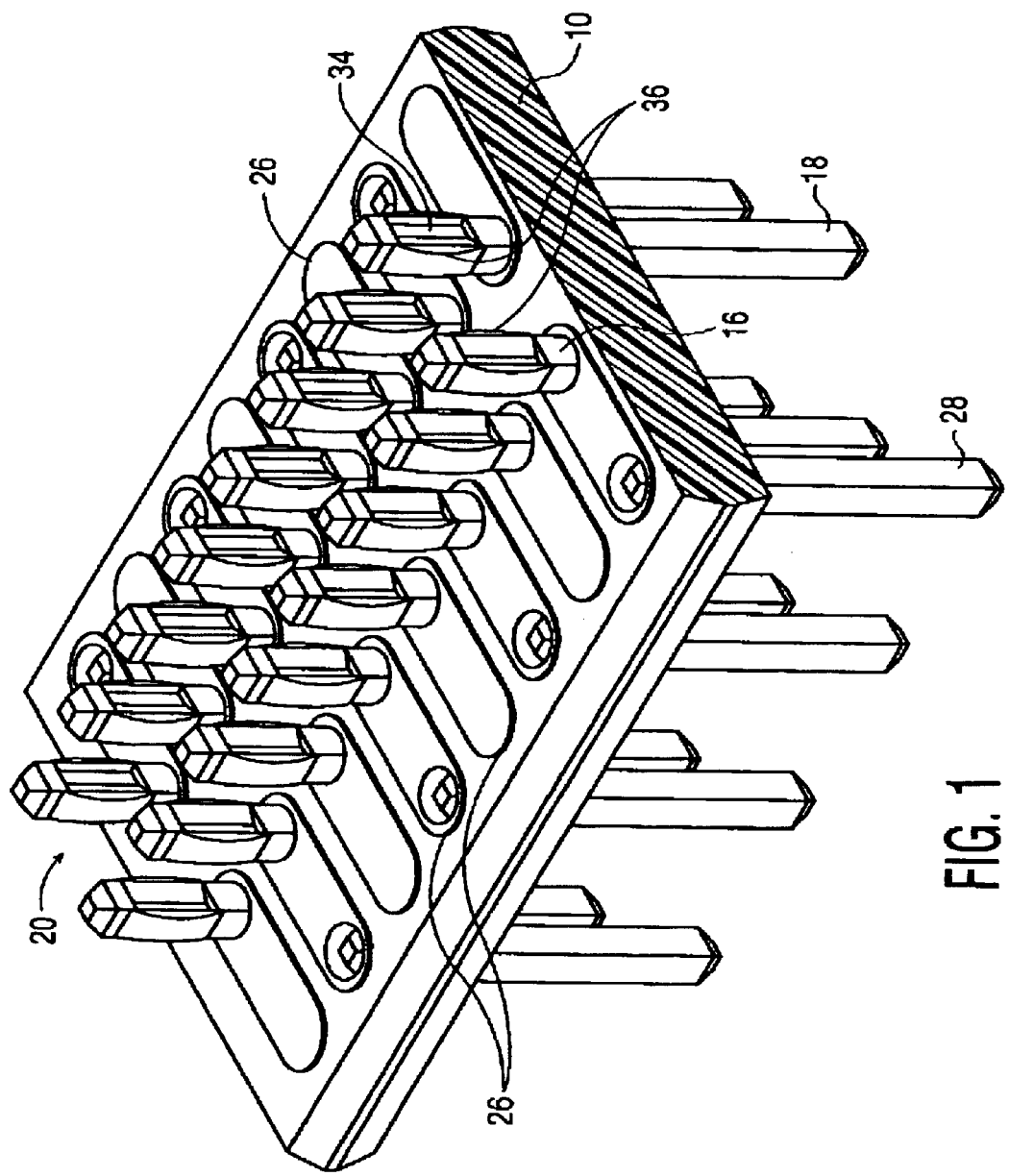
FIG. 1 is a partial perspective view of one form of pinned carrier or header in accordance with the invention prior to adding the solder reserve deposits.
Figure 2:
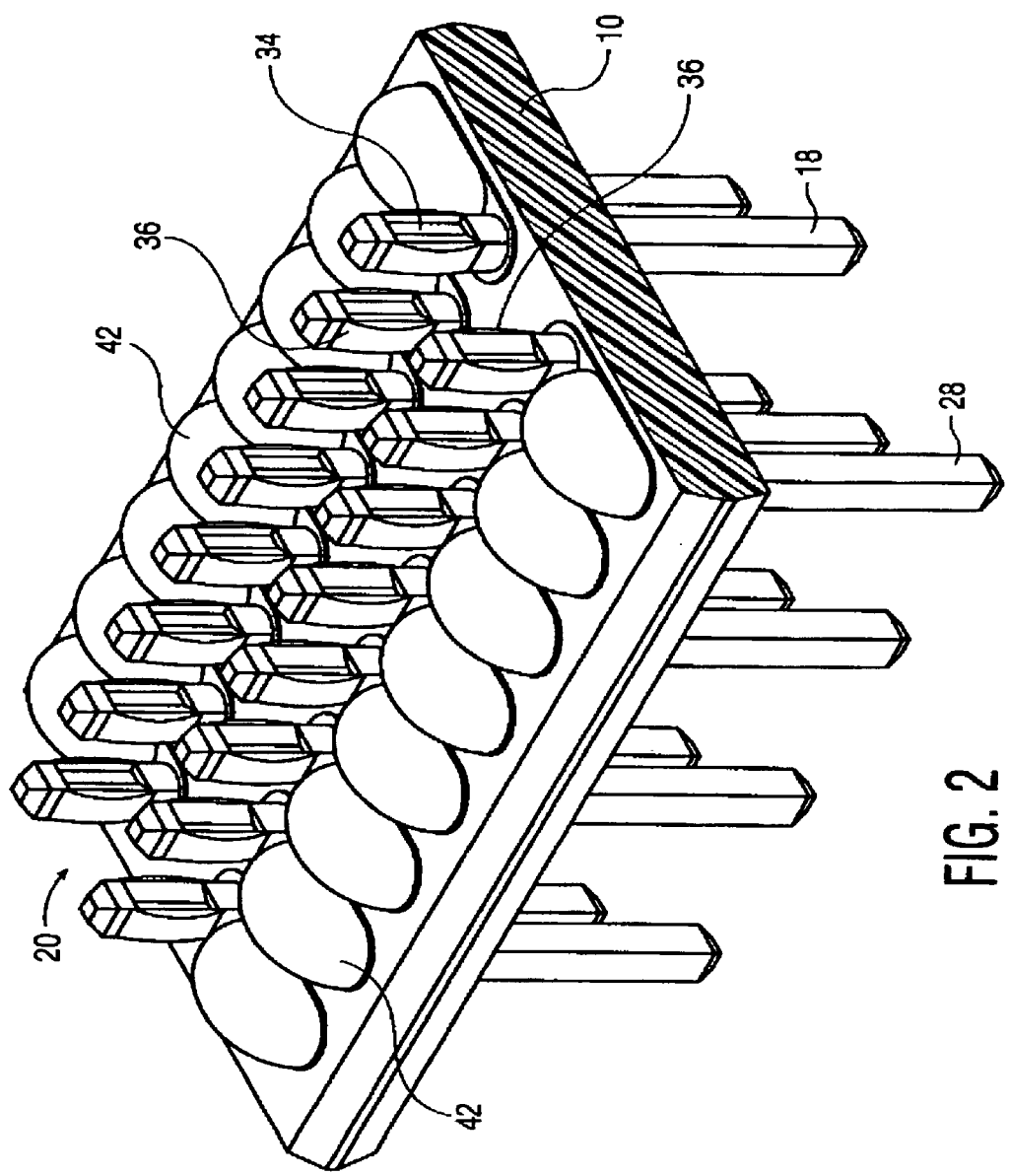
FIG. 2 is a perspective view similar to that of FIG. 1 showing the carrier after solder reserve deposits have been added.
Figure 3:
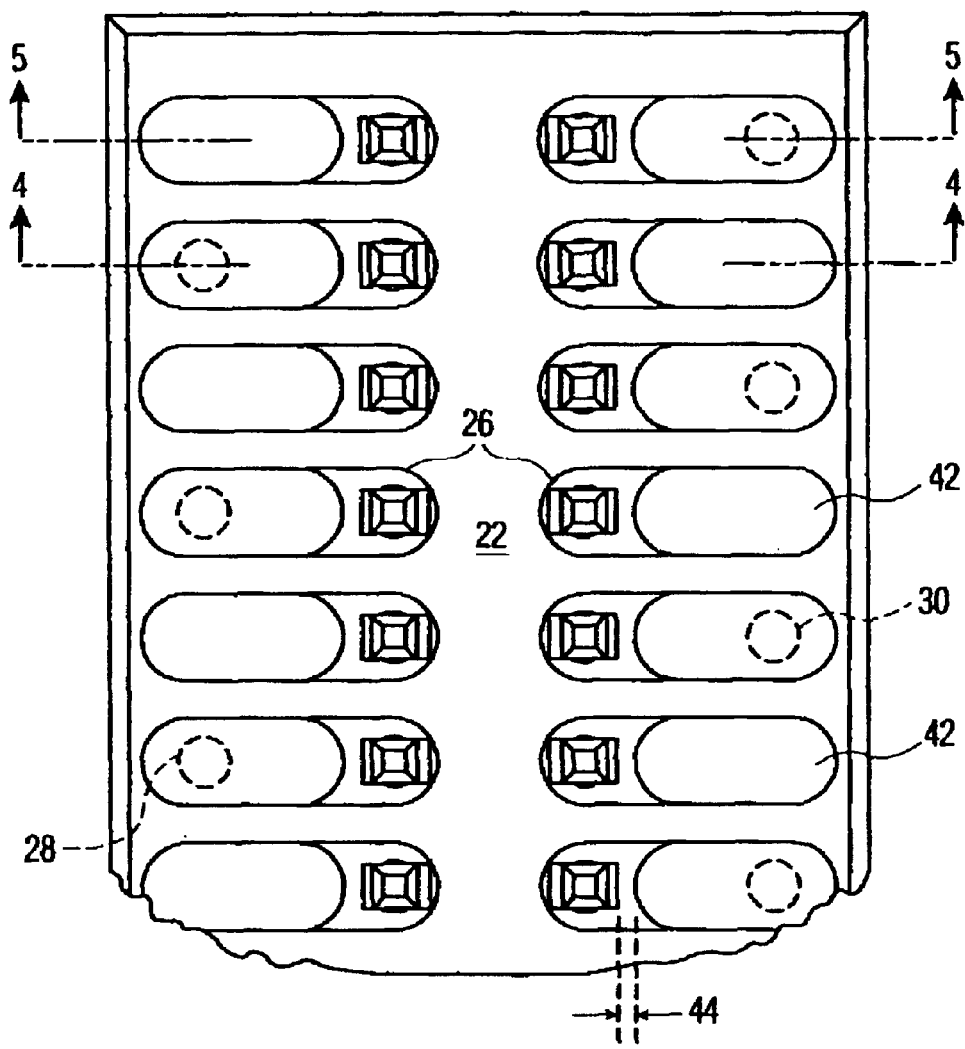
FIG. 3 is a plan view from the top of the carrier of FIG. 2.
Figure 4:
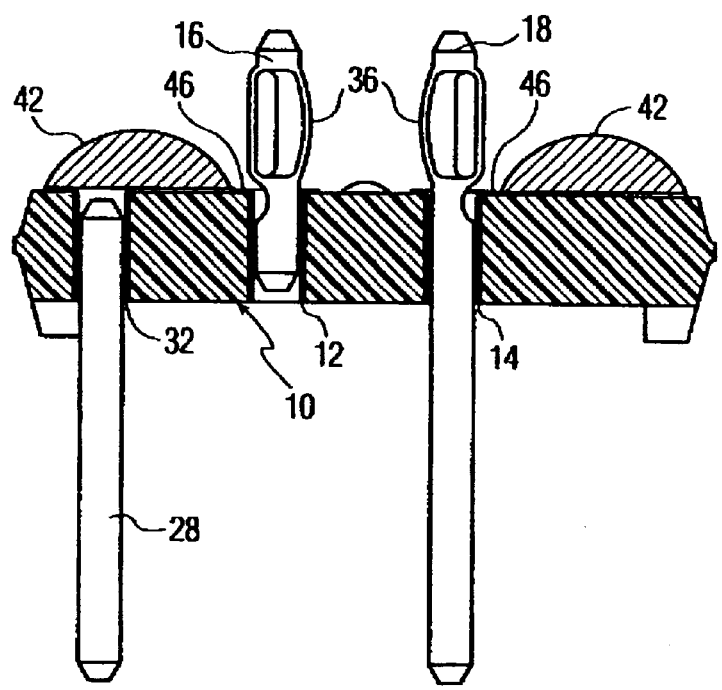
FIGS. 4 and 5 are cross-sectional views along the lines 4—4 and 5—5, respectively, of FIG. 3.
Figure 5:
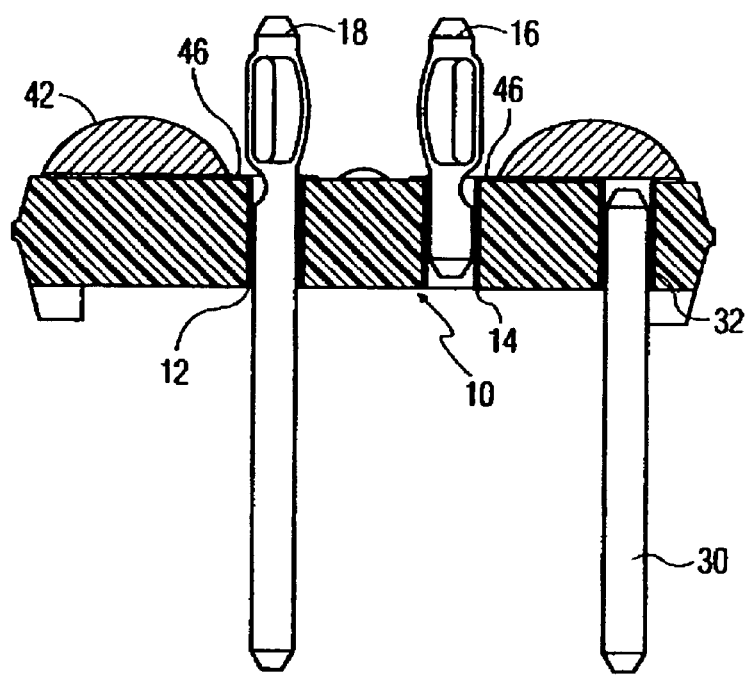
Figure 6:
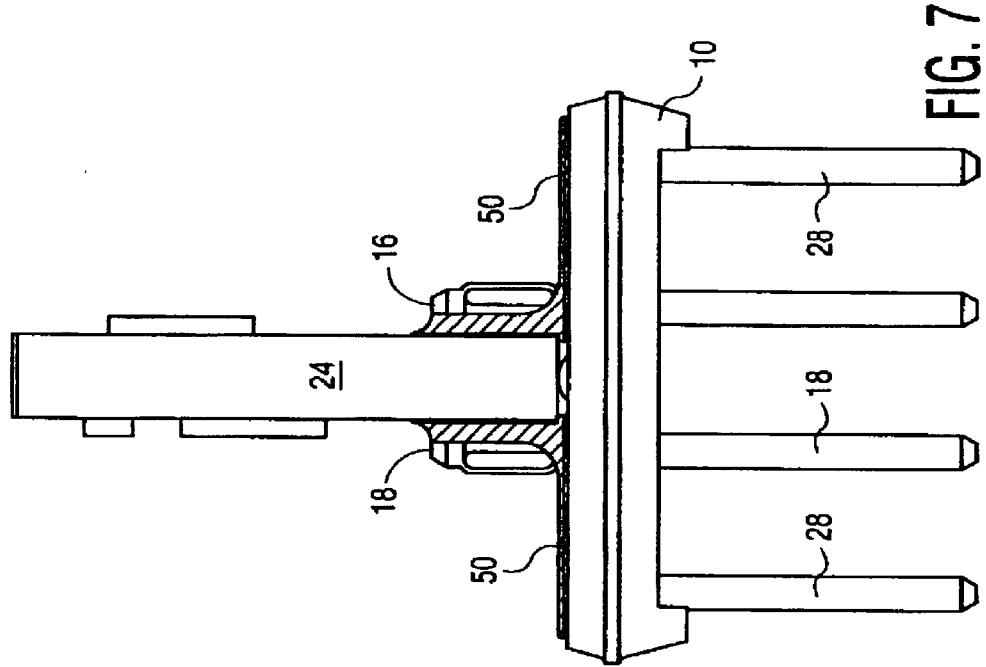
FIG. 6 is a partial end view of the upper part of the carrier of FIG. 3 after a PCB has been inserted between the facing contact pins of the carrier.

As an example to illustrate an important application of the invention, to which it is not to be limited, to address the in process requirements of the attachment of a connector to a memory card or other PCB, the unique method of the invention first inserts into a substrate or first PCB, to serve as an edge connector, dual contacts into plated through-holes of the first PCB. These plated through-holes are surrounded by or are in contact with surface mount pads. FIGS. 1–7 illustrate as the first PCB an electrically-insulating carrier 10 with dual rows of plated-through holes 12, 14 into which are inserted alternately arranged inner dual rows of short and long pins 16, 18. Both rows of inner pins form an upstanding array 20 defining a slot 22 for receiving the edge contacts of a second PCB 24. Each of the pins 16, 18 are connected to an SMT pad 26 that extends laterally on the top or first surface of the carrier 10 toward the outside edge. Third and fourth rows of pins 28, 30 are also inserted in their respective plated-through holes 32 along the outer edge of the carrier. These outer pins 28, 30 as shown extend only underneath the carrier's bottom or second surface. The upper parts of the pin rows 16, 18 are previously stamped or otherwise processed to form recesses 34 on opposite sides (the sides facing away from the opposite pin) causing contact bumps or bulges to 36 form at the pins sides facing the edge connector receiving slot 22 as well as on the their opposite backside (which does not play a role in this embodiment). The latter can be omitted by configuring the recesses 34 to bulge more on the slot side than on the backside. FIGS. 4 and 5 show this variation with the backsides more or less flat (again of no significance in this embodiment). The facing bumps 36 on the inner pin sides form contact surfaces for, for example, SMT pads 38 on the edge connector of the second PCB 24. Reference numerals 40 represent additional components that may be mounted on the second PCB 24.

On the bare surface of each of the SMT pads 26 on the carrier 10 is deposited a controlled predetermined amount of solder 42 to serve as a solder reserve. The deposits 42 are physically spaced from the adjacent upstanding pin by a distance (shown at 44 in FIG. 6), and that region 46 of the SMT pad is coated, as for example by screen printing, with a thin layer (not shown) of a flow-resist coating, such as an Entek coating, a well-known organic resin resist material. To attach each of the solder deposits to its underlying pad, the assembly is reflowed (first time) so the solder deposit melts. The flow-resist coating is used on each surface mount pad 26 to limit the solder deposit from flowing down into the plated through-holes 12, 14 and be depleted Typically, the flow-resist coating does not burn off during a first reflow step. The resist coating can also obviously be selectively applied where desired by any of well-known lithographic and masking techniques.

As will be appreciated by those skilled in the art, electrically-conductive surfaces intended for soldering are typically "tinned", i.e., provided with a very thin solder coat that promotes wetting by the molten solder, which typically also requires fluxing to remove any thin oxides that may have formed that inhibit wetting. This typical "tinned" contact cannot form a reliable solder joint with a contacted counterpart "tinned" contact unless additional solder is provided that fills in and solidifies around the contact region forming the typical fillet characteristic of well-made solder joints. During the first reflow step, the solder deposit 42 that will provide this additional solder reserve is attached to its underlying pad and prevented from flowing away by the intervening flow-resist coating. This first reflow step is carried out at a temperature below that at which the flow-resist coating is burned away—or a resist is chosen that for the most part will not burn away after just one reflow step—and is just sufficient to melt the solder deposits so they will temporarily attach to the pad. The resultant solder bumps after the first reflow step are illustrated in FIGS. 2–6 at reference numeral 42.

Next, the second PCB 24, such as the memory card, is inserted in the receiving slot 22 between the dual facing contacts 36 such that their pads 38 are in contact therewith. The dimensions are chosen such that the card 24 is held in place by a small interference fit in the slot 22, shown in FIG. 6. The dual contacts 36 are free of any additional solder that could obstruct insertion of the card edge. At least the second PCB 24 is then fluxed, or, preferably, the entire assembly is then fluxed and then run through a secondary reflow step at a higher temperature than that of the first reflow—the higher temperature may be unnecessary if a resist is chosen that will not burn away after just one reflow step but will after a second reflow step —, during which this time what remains of the flow-resist Entek coating is burned off and the molten solder from the solder deposits 42 by capillary action wick over to the adjacent plated through-holes 12, 14, flow up the pins 16, 18, and collect on the contact junction between the pin contacts 36 and the contact surfaces of the SMT pads 38 on the memory card 24. The solder adheres and completely surrounds the contact sides of each of the pins and the contacted surfaces of the SMT pads on the memory card. Some solder may also go into the plated through-hole that the pin is inserted into and solders the pin into the hole, if not previously soldered.

Figure 7:
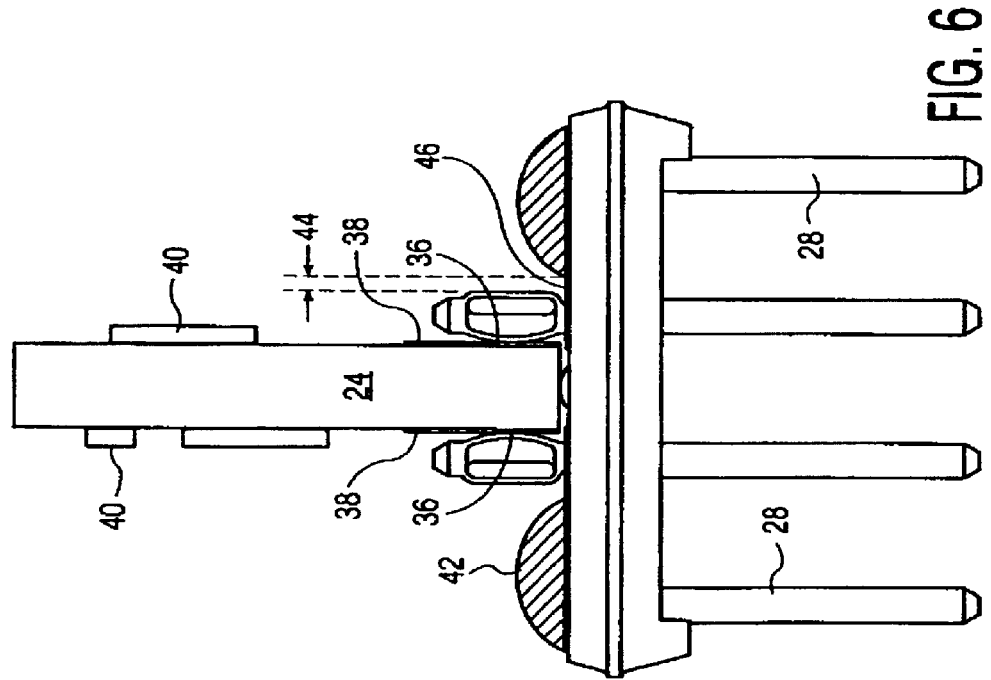
FIG. 7 is a view similar to that of FIG. 6 after the reflow step that permanently attaches the PCB to the carrier.

When the reflow step is complete and the solder hardens, as illustrated in FIG. 7, the solder under the influence of capillary action has formed a thicker layer 50 on the SMT pad, filled in any spaces at the plated-through-holes (not shown), and wicked up to fill any spaces at the edge contacts forming a good fillet around the joint and a robust reliable solder joint.

The spacing 44 between the solder deposits and the adjacent plated-through or contact which is to be occupied by the flow resist coat, depends on the size of the carrier or pins or pads, a larger spacing being allowed for larger carriers or pins or pads where the flow path is larger and a smaller spacing being allowed for smaller carriers or pins or pads where the flow path is smaller. The spacing 44 should be at a minimum about 0.001 inches, preferably about 0.003–0.06 inches. For the process where the pin is used as a transfer medium, the minimum spacing will typically be larger, about 0.02 inches. The size of the solder deposit similarly depends on the sizes of the carriers and pins and pads. It typically will occupy a volume of about 0.00001–00005 inches cubed. For an 8 position Dual Row FR-4 header using 0.025 inch pins, we have successfully used spacings 44 of about 0.03 inches and a solder deposit having a volume of about 0.000035 inches cubed. For a 100 position Dual Row FR-4 memory card adaptor/header using 0.018 inch pins, we have successfully used spacings 44 of about 0.01 inches and a solder deposit having a smaller volume. It will be appreciated that the invention is not limited to these examples, and those skilled in the art will have no difficulty in determining how large a solder deposit is required dependent upon the distance it must cover before reaching and filling the crevices at the solder joint to be made.

The contact region 36 on the pins is configured to have a smooth radius providing a good transitional contact point between the pin contact and the memory card edge pads when the memory card is inserted between the rows of pins and before the solder is transferred and the solder joint is made. Had the added solder not been contained by the flow-resistant coating, but instead been allowed to transfer to the contact region before the insertion of the card edge, then the excess solder would likely form irregular non-smooth regions that would interfere with the inserted card and likely prevent even contact between each of the contact regions and the corresponding edge pad on the inserted card.

The quantity of additional solder provided is such as to also cover a plated through-hole where a pin has been inserted from the bottom side of the carrier. Alternatively, just a surface mount pad at the carrier top surface or its bottom surface can be used without a bottom inserted pin.

The contact array 20 is arranged in a specific pattern in the carrier such that a smaller PCB (daughter board or memory card) will be held perpendicular to the carrier 10.

This solder transfer process can be used to provide an excellent solder joint for any connection between two solderable conductive means. The solder can be of the conventional composition, such as 63-37 tin-lead or 90-10 tin-lead.

The carriers 10 serving as connectors can be attached to the edge of the memory card or PCB 24 while the board is still in panel form. After fluxing the connector 10 and the SMT pads of the boards the entire panel can be reflowed. This means that the components on both sides of the boards in the panel and the added solder deposits can be reflowed at the same time. This approach eliminates the need for secondary process or off-line manufacturing as all the components and the connectors can be reflowed in the same standard process.

In the illustrated embodiment, there may or may not be present an annular ring or SMT pad on the bottom surface of the carrier for each pin.

In FIG. 7, the bottom inserted pins are also shown soldered into the plated through-holes.

Figure 8:
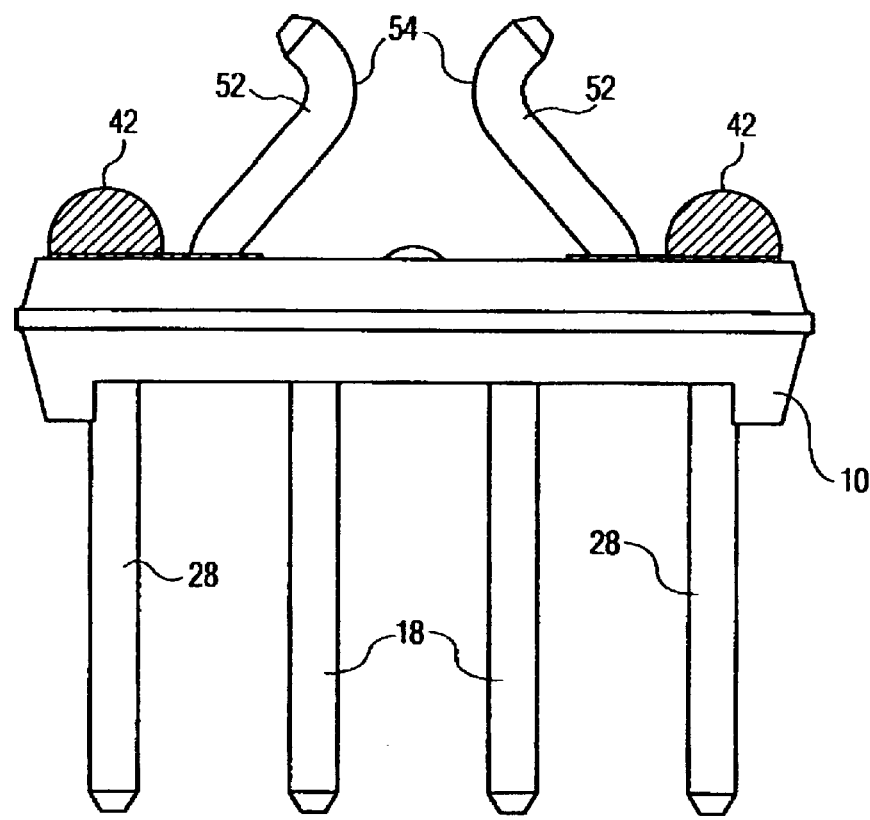
FIG. 8 is a view similar to that of FIG. 6 of a modified form of pinned carrier according to the invention after provision of the solder deposits.
Figure 9:
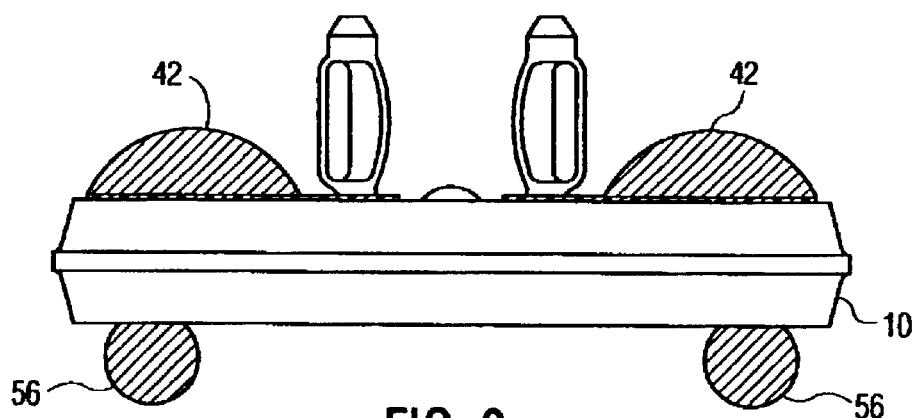
FIG. 9 is a view similar to that of FIG. 8 of a modified form of carrier using solder balls or bumps.

In the first embodiment illustrated in FIGS. 1–7, the pin configuration 16, 18 used to transfer the excess molten solder to the solder joint has straight sections, but it will be apparent that the transfer means can be of many different shapes as long as it touches the electrically-conductive surface 26 where the solder reserve 42 is deposited and also touches the electrically-conductive surface 38 of the memory card or conductive means that it is to be connected to. In other words, the transfer means, the pin 16, 18 of FIG. 1, must provide during the second reflow a continuous electrically conductive wettable solder surface path between the solder reserve source and the joints to be soldered, after the flow resistant coating, which restricts the solder flow during the first reflow or deposit attachment step, has been removed, as for example by vaporization during the second reflow. In the variation shown in FIG. 8, the pins 52 that serve as the solder transfer conduits between the solder deposits 42 and the contact regions 54 where the solder joints will be made are curved to provided a beveled entrance for the card. In the FIG. 9 variant, the bottom surface of the carrier is provided with solder balls or bumps 56 connected by means of vias (not shown) to SMT pads on the top carrier surface. The solder balls allow for easy secondary attachment using SMT processing to the motherboard instead of through-hole attachment.

Figure 12:
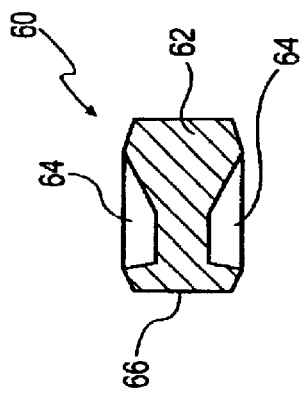
FIG. 12 is a cross-sectional view along the line 12—12 of FIG. 10.
Figure 11:
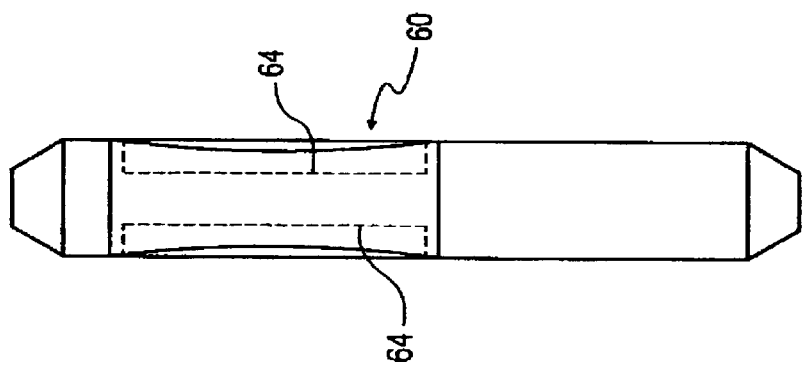
FIGS. 10 and 11 are front and side views, respectively, of one form of pin that can be employed in the invention.
Figure 10:
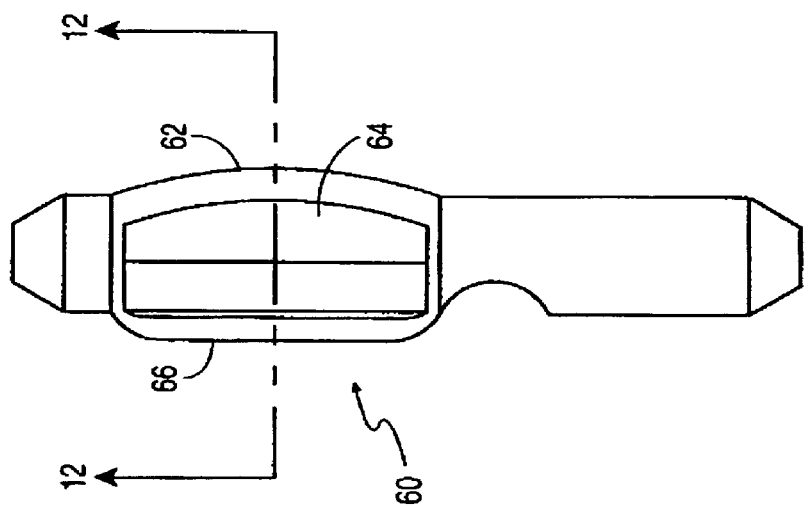
Figure 13:
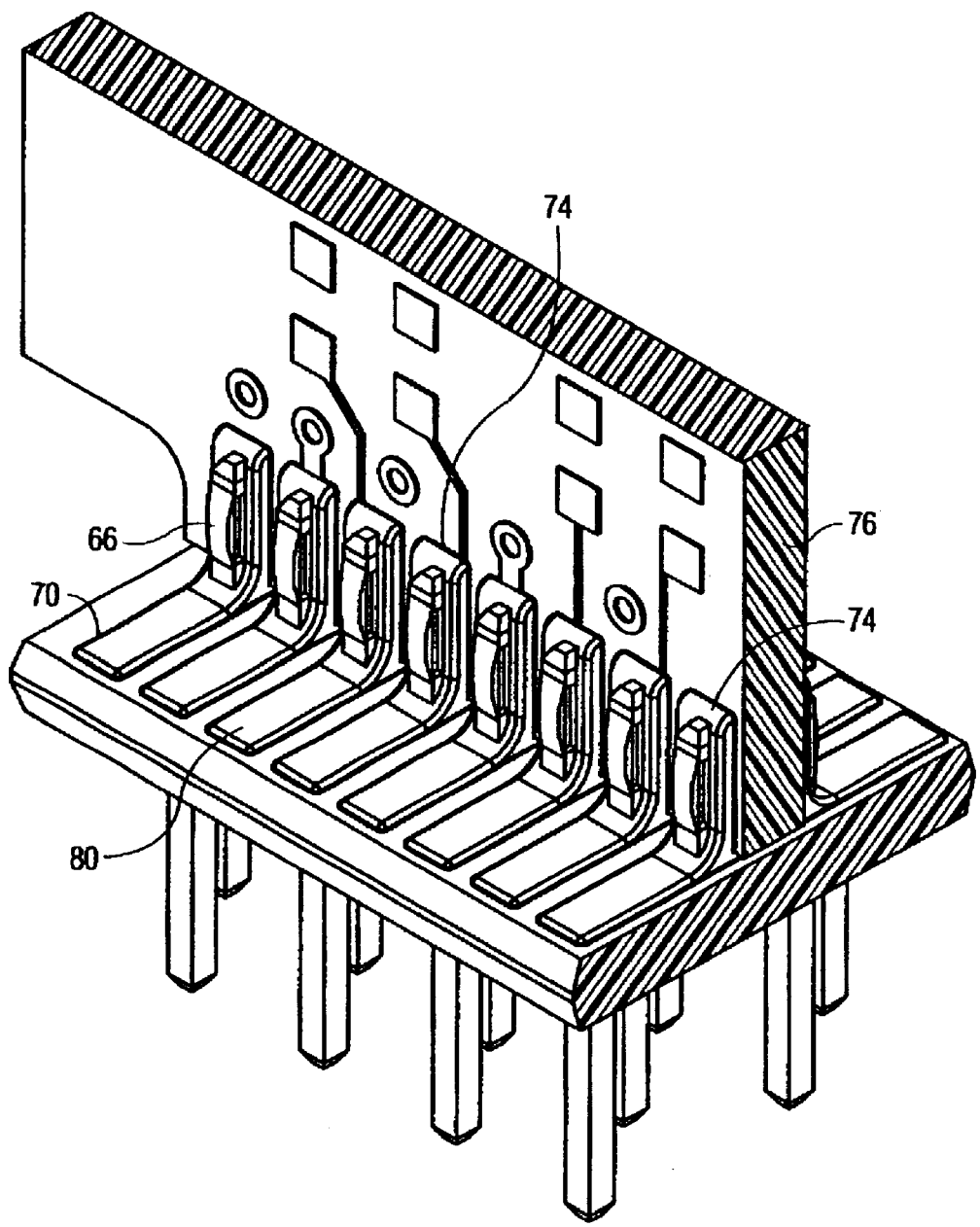
FIG. 13 is a partial perspective view of the carrier of FIG. 13 after reflow, and also illustrates a second embodiment of the invention.
Figure 14:
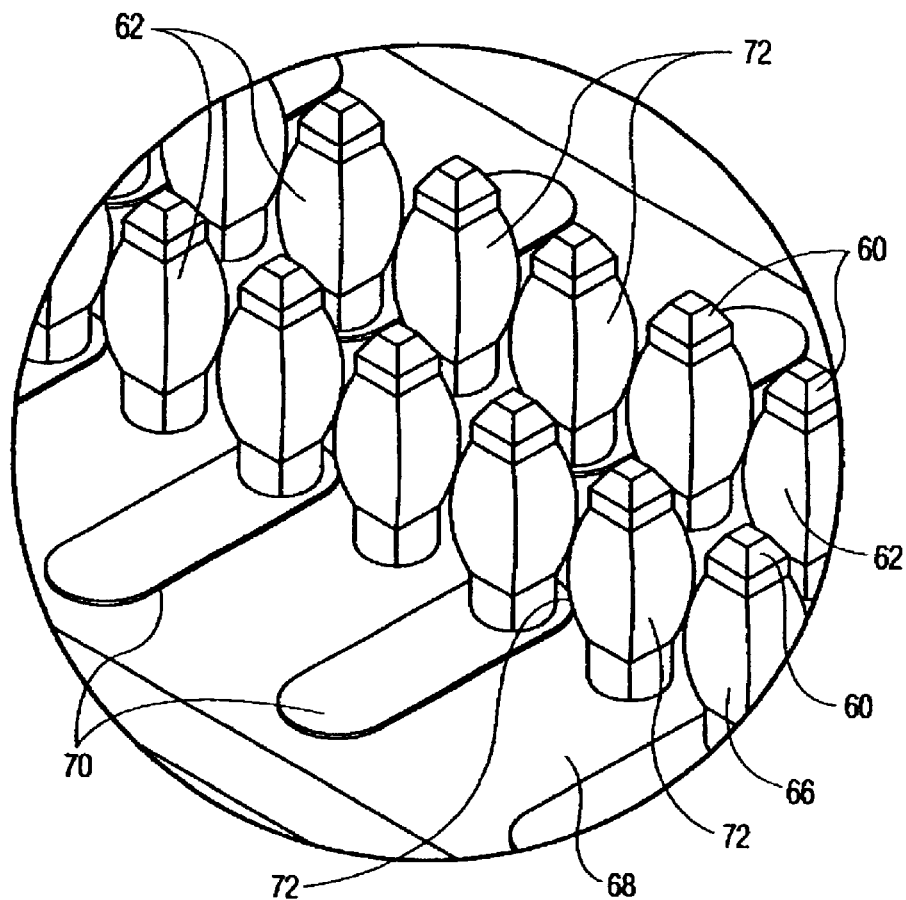
FIG. 14 is a partial perspective view of a carrier according to the invention for implementing the second embodiment of the invention.

In the embodiments so far described, the additional solder deposit is located on a solder pad away from the electrically-conductive member having the contact region that will form part of the solderjoint. In the embodiment of FIGS. 10–14, the excess solder deposit is located on a surface of the electrically-conductive member that is different from the surface having the contact region that will form part of the solderjoint. FIGS. 10–12 are examples of electrically-conductive members 60 that are punched or stamped to form a smooth curved contact region 62 on a first surface and a recess or well 64 on one or more second side surfaces that are different and spaced from the contact region 62. As with the previous embodiment, the backside surfaces 66 that do not play a role in the soldering process can be flat or curved. Preferably, the electrically-conductive members 60, pins in this example, are inserted into a carrier 68 or other PCB before the wells 64 are filled with solder to serve as the additional solder reserve. A typical carrier 68 with its SMT pads 70 connected to the inserted pins is illustrated in FIG. 13. In a preferred way of accomplishing this, a solder mask is provided (not shown) everywhere except inside the well surfaces, and then the well side of the board is run through a wave solder process which causes molten solder to fill the wells 64 on the sides, and upon cooling solidifies to form the desired solid mass of excess solder, shown at 72 in FIG. 14, as well as to solder the pins into the plated through-holes. In this case, reserve solder 72 fills both wells 64 on the side surfaces of the pin. The additional solder 72, as before, is spaced from the contact surfaces 62 which remain free of any obstructions that will interfere with insertion of the second PCB or prevent proper contact between all of the contact regions 62 and the corresponding contact regions of the second PCB.

The flow-resistant coating that prevented improper spread of the solder during the wave solder step is thereafter removed by any convenient means, or as before the second reflow is used to burn off the flow-resistant coating. After the second PCB is inserted, only the second PCB needs to be fluxed and the assembly is subjected to a second reflow (counting the wave solder step as a first reflow) during which process the molten solder from the solder deposits 72 by capillary action wick around the pins and collect on the contact junction between the pin contacts regions 62 and the contact surfaces of the SMT pads 74 on the inserted card 76, and can flow as well into the plated through-holes. The solder adheres and completely surrounds the contact sides of each of the pins and the contacted surfaces of the SMT pads on the memory card. Some solder also goes into the plated through-hole that the pin is inserted into and solders the pin into the hole.

When the reflow step is complete and the solder hardens, as illustrated in FIG. 13, the solder under the influence of capillary action has formed a thicker layer 80 on the SMT pad, filled in any spaces in the plated-through holes (not shown), and wicked around to fill any spaces at the edge contact array 74 forming a good fillet around the joint and a robust reliable solder joint.

The contact member used in the invention can be fabricated with different cross-sections, such as round, square, rectangular, and octagonal, etc. It can also have different shapes, and be fabricated by techniques in addition to stamping and punching, such as by using a screw machine approach or cold heading to make the pin rather than by stamping. The invention can be used with any kind of substrate that has openings into which a projecting member needs to be mounted by placement in the holes or can use solder bumps or other forms of interconnections. The invention can also be applied to projecting members from sockets or clips that will be soldered to an inserted component to be mounted onto a substrate.

Figure 15:
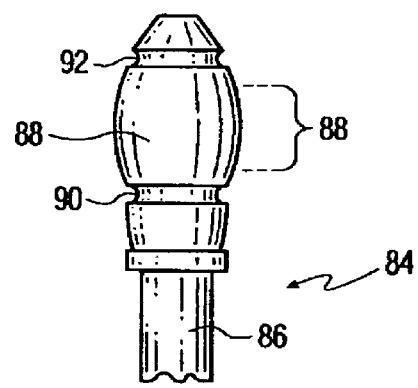
FIG. 15 is a partial plan view from the front showing a modified pin design according to the invention.

FIG. 15 illustrates a modified pin design of the screw machine type, comprising an electrically-conductive member 84 having a post 86 for mounting to a substrate, and a contact part 88. The latter has a curved top with a widened part designated 88 that forms the contact region that makes contact with the pads on the card when inserted between two lines of posts of the type illustrated. Spaced below and above, respectively, the contact region 88 are annular recesses 90, 92 which receive the solder deposits (not shown). The latter can be achieved by masking all but the recesses and wave soldering or other equivalent means that results in solidified melted solder filling the recesses 90, 92. The solidified solder (not shown in FIG. 15) remains spaced from the contact region 88. After the card has been mounted and the assembly reflowed, as before, the solder filling the recesses melts and wicks over to the contact region forming the desired robust solder joint at the contact region 88 with the mounted card (not shown).

Any solderable material, such as copper or copper alloy, brass or brass alloy, and phosphor bronze, can be used in this application. The overall pin lengths can cover a wide range, for example, from 0.25–2 inches.

It will be noted that the solder reserve, before transfer, preferably is a mass of solid material, which is preferably melted solder, preferably formed by a separate reflow step, and is not wet solder paste or any other kind of non-solid material.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A daughter card adapter for receiving and supporting a daughter card for connection to a motherboard, the daughter card comprising contact areas along both sides of an edge of the card, the daughter card adapter comprising:
   a) a substrate having at least two parallel rows of laterally spaced, upstanding connectors having facing regions, the contact regions forming a first pattern matching that of the card's contact areas,
   b) a plurality of contact pads on a first surface of the substrate each adjacent and in contact with one of the upstanding connectors,
   c) a discrete solder deposit of solidified solder on each of the contact pads at a first location spaced from the adjacent upstanding connector, the closest part of the solder deposit being spaced from the contact region of the adjacent upstanding connector by a
   d) the upstanding connectors having at the contact regions insufficient solder for effecting a robust solder joint to contact areas on the daughter card when the adaptor and the supported daughter card are engaged and reflowed,
   e) each of the solidified solder deposits containing sufficient solder for effecting a robust solder joint between the upstanding connectors' contact regions and the contact areas on the daughter card when the adaptor and the engaged daughter card are heated to reflow temperature causing the solder deposit to melt and wick along the contact pad to the adjacent upstanding connector and then to flow up to its contact region.

2. A daughter card adapter as claimed in claim 1, wherein the solder deposit is reflowed solder.

3. A daughter card a as claimed in claim 1, wherein the spacing between the first location and the adjacent contact region is at least about 0.001 inches, and the amount of the solder deposit is at least about 0.00001 inches cubed.

4. A daughter card adapter as claimed in claim 1, wherein the daughter card adapter comprises a plurality of contacts on a second surface of the substrate, the plurality of contacts on the second surface of the substrate forming a second pattern for engaging a like pattern of contacts on the motherboard.

5. A daughter card adapter as claimed in claim 4, wherein the second pattern is different from the first pattern.

6. A substrate having plated though-holes, and a pin mounted in a plated though-hole, the pin having at a region at least first and second spaced surfaces, the first surface being shaped to serve later as a contact surface with another object the first surface being free of any additional solder that will interfere with its later contact with the other object, the second surface containing a well or recess an, amount of solidified previously-melted solder filling the well or recess and serving as a reserve solder deposit for a soldered connection to be later made at the first surface with the other object, wherein the pin has four external surfaces at the region, the first surface being a front surface of the region, the second surface including a side surface of the region.

7. The combination of:
(I) a substrate having first and second surface portions,
(II) a plurality of aligned plated though-holes in the substrate arranged in at least two spaced rows,
(III) a plurality of upstanding aligned male contact members mounted on the first substrate surface and also arranged in at least two spaced rows, each male contact being laterally spaced from an adjacent though-hole, the space rows of male contacts being laterally spaced and facing an opposite male contact such as to form a slotted receiving and contact region for card contact pads of an inserted edge contact card,
(IV) a plurality of substrate solder pads on the first substrate surface, each of the substrate solder pads extending continuously between and in contact with one of the male contacts and the adjacent plated though-hole,
(V) a series of external contacts the second substrate surface each in contact with an adjacent plated through-hole,
(VI) a discrete solder deposit on each of the substrate contact pads at a first location spaced by a minimum distance from the adjacent upstanding male contact, the closest part of the solder deposit being spaced from the adjacent upstanding male contact such that, when the substrate and an inserted edge contact card are heated to reflow temperature, the solder deposits are melted and wick along the adjacent contact pad to the adjacent upstanding male contact thereby, upon cooling forming a robust solder joint between the male contacts and the pads of the inserted edge contact card.

8. The combination of claim 7, further comprising a coating of flow-resistant material on the contact pads between the closest part of the solder deposit and the adjacent upstanding male contact, the flow-resistant material vaporizing during the heating to reflow temperature.

9. The combination of claim 7, wherein the external contacts on the second substrate surface are contact pins or solder bumps.

10. The combination of claim 7, wherein each of the solder deposits is located on the side of the substrate contact pad remote from the male contacts.

11. The combination of claim 7, wherein the substrate is a header for mounting the soldered edge contact card on a motherboard.

12. A solder reserve and transfer device for a connector, comprising:
a) a first location on the connector comprising a first electrical contact to be soldered to another electrical contact, said first location containing an insufficient solder amount for effecting a robust solder joint between the first and the electrical contact when the device and connector are reflowed, the first location being a first surface region on an elongated electrically-conductive member,
b) means for connecting the dc vice to the connector,
c) a second location on the device and spaced from the first location and comprising a reserve amount of solder sufficient for effecting a robust solder joint between the first and the other electrical contact when transferred to the first location, the second location being a second surface region on the electrically-conductive member,
d) the amount of the reserve and its spacing from the first contact being such that, upon heating the device and connector to its reflow temperature, the reserve will melt and wick from its position at the second location to the air location such that upon cooling a robust solder joint between the first and the other electrical contact is effected,
e) the electrically-conductive member comprising a pin formed to have at one end a recess, the forming being such as to form a recess at the second surface for receiving the solder deposit and also form a convex surface spaced from the recess at the first surface to form the first electrical contact.

13. A process for fabricating a header for receiving an edge contact card and for later mounting onto a motherboard, comprising the steps:
(I) providing a substrate having:
a) first and second surface portions,
b) a plurality of aligned plated through-holes in the substrate arranged in at least two spaced rows,
c) a plurality of upstanding aligned male contact members mounted on the first substrate surface and also arranged in at least two spaced rows, each male contact being laterally spaced from an adjacent through-hole, the spaced rows of male contacts being lately spaced and facing an opposite male contact such as to form a slotted receiving and contact region for card contact pads of a later inserted edge contact card,
d) a plurality of substrate solder pads on the first substrate surface, each of the substrate solder pads extending between and in contact with one of the male contacts and the adjacent coated through-hole,
e) a series of external contacts on the second substrate surface each in contact with an adjacent plated through-hole;
(II) providing on each substrate solder pad and the adjacent plated through-hole a solder-flow-resist layer except for a deposit-receiving region laterally spaced from the adjacent male contact,
(III) depositing on each of the deposit-receiving regions a predetermined amount of solder,
(IV) reflowing first time the substrate to attach the solder deposite to each of the deposit-receiving regions, the reflowing step and the flow-resist layer being such that the flow-resist layer remains substantially intact during the reflowing step the flow-resist layer preventing the reflowed solder deposit from wicking to the adjacent male contact, (V) inserting an edge contact card-receiving region such that the cards' contact pads engage opposite contact regions on the facing male contacts, the contact regions on the facing male contacts lacking sufficient solder for effecting a robust solder joint between the cards' contact pads and the opposite contact regions on the facing male contacts when the substrate and card are again reflowed, (VI) reflowing a second time the substrate, this time with the inserted card in place, to cause the solder deposits to melt, the solder-flow-resist layer if preset to burn off, and the molten solder to wick along its substrate contact pad to the joint between the cards' contact pads and the opposite contact regions on the facing male contacts, each solder deposit containing sufficient solder for effecting a robust solder joint between the cards' contact pads and the opposite contact regions on the facing male contact when the substrate and card are cooled.

14. The process as claimed in claim 13, wherein the spacing between the deposit receiving region and the adjacent male contact is at least about 0.001 inches, and the amount of the solder deposit is at least about 0.00001 inches cube.

15. The process as claimed in claim 13, wherein the spacing between the deposit receiving region and the adjacent male contact is at least about 0.02 inches, and the amount of the solder deposit is at least about 0.000035 inches cubed.

16. The process as claimed in claim 13, wherein step VI is carried out in the presence of flux.

17. A process for fabricating a header for receiving an edge contact card and for later mounting onto a motherboard, comprising the steps:

(I) providing a substrate having:
　a) first and second surface portions,
　b) a plurality of aligned plated through-holes in the substrate arranged in at least two spaced rows,
　c) a plurality of upstanding aligned male contact members mounted on the first substrate surface and also arranged in at least two spaced rows, each male contact, being laterally spaced from an adjacent through-hole, the spaced rows of male contacts, being laterally spaced and facing an opposite male contact such as to form a slotted receiving and contact region for card contact pads of a later insert edge contact card, each male contact having a contact region and spaced from the contact region a recess,
　d) a plurality of substrate solder pads on the first substrate surface, each of the substrate solder extending between and in contact with one of the male contacts and the adjacent coated through-hole,
　e) a series of external contacts on the second substrate each in contact with an adjacent plated through-hole;

(II) providing on at least each of the male contact members including its contact region a solder-flow layer except for its recess that will serve as a solder-deposit-receiving region, (III) wave soldering the assembly to deposit in each of the deposit-receiving regions a predetermined amount of solder, the flow-resist layer preventing the solder from depositing on the contact region, (IV) inserting an edge contact card in the card-receiving region such that the cards' contact pads engage opposite contact regions on the facing male contacts, the contact regions on the facing male contacts lacking sufficient solder for effecting a robust solder joint between the cards' contact pads and the opposite contact regions on the facing male contacts when the substrate and card are reflowed, (V) reflowing the substrate with the inserted card in place to cause the solder deposits to melt, the solder-flow layer if present to burn off, and the molten solder to wick along the contact member to the joint the cards' contact pads and the opposite contact regions on the facing male contacts, each solder deposit containing sufficient solder for effecting a robust solder joint between the cards' contact pads and the opposite contact regions on the facing male contacts when the substrates and card are cooled.

18. The process as claimed in claim 17, wherein step V is carried out in the presence of flux.

* * * * *

UNITED STATES PATENT AND TRADEMARK OFFICE
CERTIFICATE OF CORRECTION

PATENT NO. : 6,780,028 B1
DATED : August 24, 2004
INVENTOR(S) : C. Kennedy et al.

It is certified that error appears in the above-identified patent and that said Letters Patent is hereby corrected as shown below:

Column 8,
Line 49, should read -- the adjacent upstanding connector by a predetermined distance, --;

Column 9,
Line 14, a comma "," should be present between "object" and "the";
Line 16, should read -- the second surface containing a well or recess, an amount of --;

Column 10,
Line 11, "dc vice" should read -- device --;
Line 23, "air" should read -- first --;
Line 61, after "reflowing" -- a -- should be inserted;
Line 65, a comma "," should be present between "step" and "the";

Column 11,
Line 11, "bum" should read -- burn --;

Column 12,
Line 8, before "extend-" -- pads -- should be inserted;
Line 15, "solder-flow" should read -- solder-flow-resist --;
Line 33, after "joint" -- betweeen -- should be inserted.

Signed and Sealed this

Thirtieth Day of November, 2004

JON W. DUDAS
*Director of the United States Patent and Trademark Office*